United States Patent
Chen et al.

(10) Patent No.: US 10,867,993 B2
(45) Date of Patent: Dec. 15, 2020

(54) TOUCH SENSING CIRCUITS AND METHODS FOR DETECTING TOUCH EVENTS

(71) Applicant: Vanguard International Semiconductor Corporation, Hsinchu (TW)

(72) Inventors: Fu-Hsin Chen, Jhudong Township, Hsinchu County (TW); Shin-Cheng Lin, Tainan (TW); Yung-Hao Lin, Jhunan Township, Miaoli County (TW); Hsin-Chih Lin, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/824,779

(22) Filed: Mar. 20, 2020

(65) Prior Publication Data
US 2020/0219870 A1  Jul. 9, 2020

Related U.S. Application Data

(62) Division of application No. 15/974,018, filed on May 8, 2018, now Pat. No. 10,692,857.

(51) Int. Cl.
*H01L 27/06* (2006.01)
*H01L 29/06* (2006.01)
(Continued)

(52) U.S. Cl.
CPC ...... *H01L 27/0605* (2013.01); *H01L 21/7605* (2013.01); *H01L 21/8252* (2013.01);
(Continued)

(58) Field of Classification Search
CPC ............ H01L 27/0605; H01L 29/7787; H01L 21/8252; H01L 21/7605; H01L 28/20;
(Continued)

(56) References Cited

U.S. PATENT DOCUMENTS 9,754,932 B2 *  9/2017  Liao .................... H01L 29/7786
10,411,098 B2 *  9/2019  Chen .................... H01L 29/7786
(Continued)

FOREIGN PATENT DOCUMENTS

TW    201421648 A    6/2014
TW    201705445 A    2/2017
TW    201732956 A    9/2017

*Primary Examiner* — Alexander O Williams
(74) *Attorney, Agent, or Firm* — Birch, Stewart, Kolasch & Birch, LLP

(57) ABSTRACT

A semiconductor structure includes a substrate, a first III-V compound layer, a second III-V compound layer, a third III-V compound layer, and a fourth III-V compound layer. The top of the substrate includes a first region and a second region. The first III-V compound layer is in the first region. The second III-V compound layer is disposed over the first III-V compound layer. A first carrier channel is formed between the first III-V compound layer and the second III-V compound layer. The second III-V compound layer has a first thickness. The third III-V compound layer is in the second region. The fourth III-V compound layer is disposed over the third III-V compound layer. A second carrier channel is formed between the fourth III-V compound layer and the third III-V compound layer. The fourth III-V compound layer has a second thickness less than the first thickness.

4 Claims, 6 Drawing Sheets

(51) Int. Cl.
- *H01L 29/20* (2006.01)
- *H01L 29/205* (2006.01)
- *H01L 49/02* (2006.01)
- *H01L 29/66* (2006.01)
- *H01L 21/76* (2006.01)
- *H01L 21/8252* (2006.01)
- *H01L 29/778* (2006.01)
- *H02M 3/335* (2006.01)

(52) U.S. Cl.
CPC .......... *H01L 28/20* (2013.01); *H01L 29/0649* (2013.01); *H01L 29/2003* (2013.01); *H01L 29/205* (2013.01); *H01L 29/66462* (2013.01); *H01L 29/7787* (2013.01); *H02M 3/33523* (2013.01)

(58) Field of Classification Search
CPC ............... H01L 29/905; H01L 29/2003; H01L 29/0649; H01L 29/66462; H01L 21/7607; H01L 27/0629; H01L 29/7786; H01L 29/86; H01L 27/06; H01L 29/778; H01L 21/76; H01L 29/66; H01L 49/02; H01L 29/205; H01L 29/20; H01L 29/06; H02M 3/33523; H02M 3/33507

USPC .......................................................... 257/76

See application file for complete search history.

(56) References Cited

U.S. PATENT DOCUMENTS

| | | | |
|---|---|---|---|
| 10,692,857 B2* | 6/2020 | Chen | H01L 21/7607 |
| 2007/0292999 A1 | 12/2007 | Henning et al. | |
| 2014/0183598 A1* | 7/2014 | Chiu | H01L 29/4236 |
| | | | 257/190 |
| 2015/0228730 A1* | 8/2015 | Yang | H01L 27/0922 |
| | | | 257/369 |
| 2016/0359035 A1* | 12/2016 | Yu | H01L 29/2003 |
| 2017/0025406 A1* | 1/2017 | Liao | H01L 27/0629 |
| 2017/0141218 A1* | 5/2017 | Iucolano | H01L 21/0254 |
| 2018/0179637 A1 | 6/2018 | Roberge et al. | |
| 2019/0131416 A1 | 5/2019 | Chiu et al. | |
| 2019/0348411 A1* | 11/2019 | Chen | H01L 29/205 |

* cited by examiner

TOUCH SENSING CIRCUITS AND METHODS FOR DETECTING TOUCH EVENTS

This application is a Division of copending application Ser. No. 15/974,018, filed on May 8, 2018, which is hereby expressly incorporated by reference into the present application.

BACKGROUND OF THE INVENTION

Field of the Invention

The disclosure relates generally to a semiconductor structure and a method of manufacturing the same, and more particularly it relates to a semiconductor structure combining passive components with high electron mobility transistors (HEMT).

Description of the Related Art

In recent years, the development of semiconductor devices for use in computers, consumer electronics, and other fields has progressed rapidly. Currently, semiconductor device technology has been widely accepted in Metal-Oxide-Semiconductor Field-Effect Transistor (MOSFET) products that are marketed with a high market share.

Gallium nitride on silicon (GaN-on-Si) based devices have become an attractive option for power devices over the past few years. Gallium nitride transistor devices provide for a high electron mobility in a two-dimensional electron gas (2-DEG) located near the interface of a AlGaN and a GaN heterostructure interface. The high electron mobility provides for a good power gain at high frequencies used in radio frequency (RF) applications. However, existing semiconductor devices have not been satisfactory in every respect.

BRIEF SUMMARY OF THE INVENTION

In an embodiment, a semiconductor structure comprises a substrate, a first III-V compound layer, a second III-V compound layer, a third III-V compound layer, and a fourth III-V compound layer. The top of the substrate comprises a first region and a second region. The first III-V compound layer is deposited in the first region. The second III-V compound layer is deposited over the first III-V compound layer. The first carrier channel is formed at the interface between the first III-V compound layer and the second III-V compound layer. The second III-V compound layer has a first thickness. The third III-V compound layer is deposited in the second region. The fourth III-V compound layer is deposited over the third III-V compound layer. A second carrier channel is formed at the interface between the fourth III-V compound layer and the third III-V compound layer. The fourth III-V compound layer has a second thickness which is less than the first thickness.

According to an embodiment of the invention, the semiconductor structure further comprises an insulating layer. The insulating layer is formed between the first region and the second region.

According to an embodiment of the invention, the insulating layer is formed by mesa etching.

According to an embodiment of the invention, the insulating layer is formed by implanting oxygen or nitrogen into the III-V compound layer between the first region and the second region.

According to an embodiment of the invention, the composition of the first III-V compound layer and that of the third III-V compound layer are identical.

According to an embodiment of the invention, the composition of the second III-V compound layer and that of the fourth III-V compound layer are identical.

According to an embodiment of the invention, the first III-V compound layer and the third III-V compound layer comprise a GaN layer, wherein the second III-V compound layer and the fourth III-V compound layer comprises an AlxGa1-xN layer, and 0<x<1. According to an embodiment of the invention, the semiconductor structure further comprises a gate structure, a source region, and a drain region. The gate structure is deposited over the second III-V compound layer. The source region and the drain region are respectively deposited on two opposite sides of the gate structure and over the first III-V compound layer. The first carrier channel extends from the source region to the drain region.

According to an embodiment of the invention, a HEMT device is formed in the first region.

According to an embodiment of the invention, the semiconductor structure further comprises a first electrode and a second electrode. The first electrode is deposited over the third III-V compound layer. The second electrode is deposited over the third III-V compound layer. The second carrier channel extends between the first electrode and the second electrode.

According to an embodiment of the invention, a resistor is formed in the second region.

According to an embodiment of the invention, the conductivity of the resistor is positively correlated to the second thickness. The resistance of the resistor is negatively correlated to the second thickness.

According to an embodiment of the invention, the first electrode or the second electrode is electrically coupled to the source region.

According to another embodiment of the invention, the first electrode or the second electrode is electrically coupled to the drain region.

In an embodiment, a manufacturing method of a semiconductor structure comprises: providing a substrate, wherein the top of the substrate comprises a first region and a second region; forming a bottom III-V compound layer over the substrate; forming a top III-V compound layer over the bottom III-V compound layer; and forming an insulating layer between the first region and the second region such that the bottom III-V compound layer is divided into a first III-V compound layer and a third III-V compound layer and the top III-V compound layer is divided into a second III-V compound layer and a fourth III-V compound layer. The first III-V compound layer and the second III-V compound layer are deposited in the first region, and the third III-V compound layer and the fourth III-V compound layer are deposited in the second region. A first carrier channel is formed at the interface between the first III-V compound layer and the second III-V compound layer, and a second carrier channel is formed at the interface between the third III-V compound layer and the fourth III-V compound layer.

According to an embodiment of the invention, the manufacturing method further comprises: forming a gate structure over the second III-V compound layer; and forming a source region and a drain region on two opposite sides of the gate structure. The first carrier channel extends between the source region and the drain region.

According to an embodiment of the invention, the manufacturing method further comprises: forming a first electrode over the third III-V compound layer; and forming a second electrode over the third III-V compound layer, wherein the second carrier channel extends between the first electrode and the second electrode.

According to an embodiment of the invention, the second III-V compound layer has a first thickness. The manufacturing method further comprises: etching the fourth III-V compound layer such that the fourth III-V compound layer has a second thickness, wherein the second thickness is less than the first thickness. The resistance between the first electrode and the second electrode is negatively correlated to the second thickness.

According to an embodiment of the invention, the manufacturing method further comprises: electrically coupling the first electrode or the second electrode to the source region.

According to another embodiment of the invention, the manufacturing method further comprises: electrically coupling the first electrode or the second electrode to the drain region.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
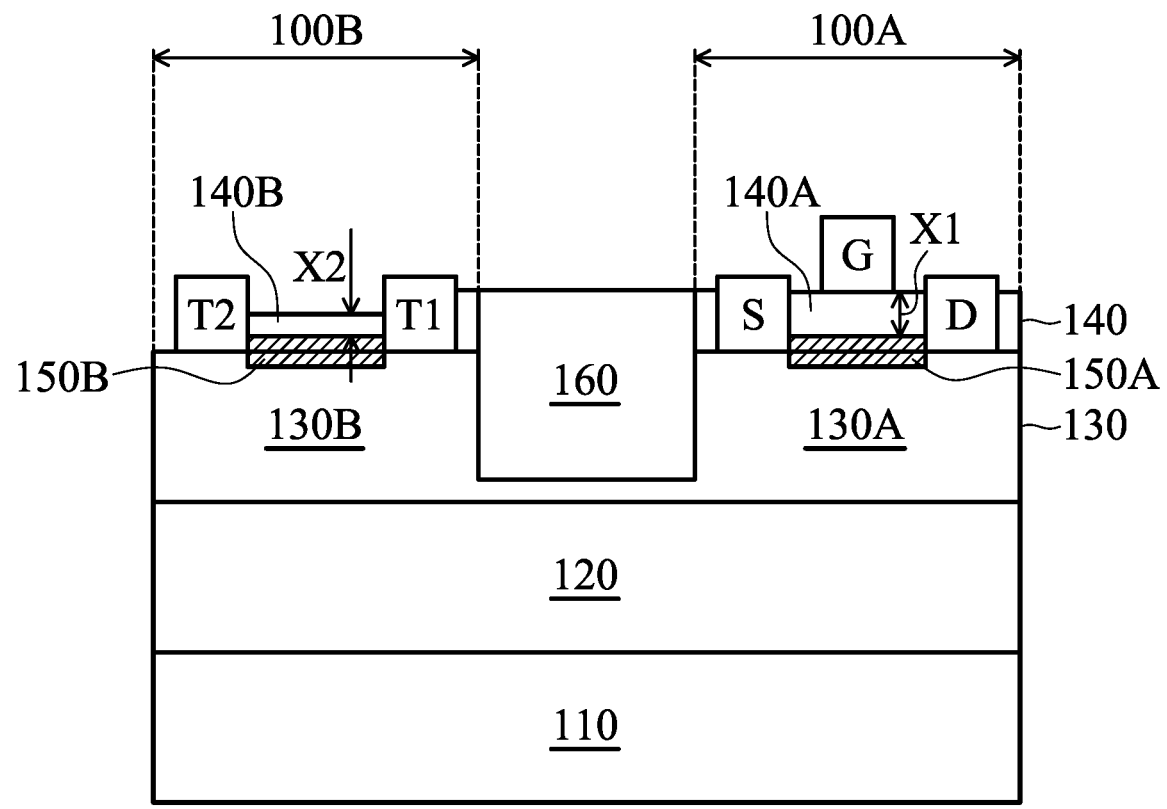
FIG. 1 is a cross-sectional view of a semiconductor structure in accordance with an embodiment of the invention.

The semiconductor device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

It should also be noted that the present disclosure presents embodiments of a semiconductor device, and may be included in an integrated circuit (IC) such as a microprocessor, memory device, and/or other device. The IC may also include various passive and active microelectronic devices, such as thin film resistors, other capacitors (e.g. a metal-insulator-metal capacitor, MIMCAP), inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, or other types of transistors. One of ordinary skill may recognize that the high-voltage semiconductor devices may be used in other type of semiconductor elements.

FIG. 1 is a cross-sectional view of a semiconductor structure in accordance with an embodiment of the invention. As shown in FIG. 1, the semiconductor structure 100 includes a substrate 110. The substrate 110 may include, but is not limited to, semiconductor substrate such as a silicon substrate. In addition, the substrate 110 may include an element semiconductor which may include germanium; compound semiconductor which may include silicon carbide, gallium arsenide, gallium phosphide, indium phosphide, indium arsenide and/or indium antimonide; alloy semiconductor which may include SiGe alloy, GaAsP alloy, AlInAs alloy, AlGaAs alloy, GaInAs alloy, GaInP alloy and/or GaInAsP alloy, or a combination thereof. In addition, the substrate 110 may include semiconductor-on-insulator. In addition, the substrate 110 may include an epitaxial layer (not shown). For example, the substrate 110 may have an epitaxial layer overlying a bulk semiconductor. Furthermore, the substrate 110 may include a semiconductor-on-insulator (SOI) structure. For example, the substrate 110 may include a buried oxide (BOX) layer formed by a process such as separation by implanted oxygen (SIMOX), or another suitable technique such as wafer bonding and grinding.

As shown in FIG. 1, the semiconductor device 100 also includes a buffer layer 120. In some embodiments, the buffer layer 120 is disposed over the substrate 110. The buffer layer 120 is used to reduce strain between the substrate 110 and the subsequently formed III-V compound layer. In some embodiments, the buffer layer 120 includes an AlN nucleation layer, an AlGaN layer or a combination thereof. The buffer layer 120 is also used to reduce defects caused by the dislocation between the substrate 110 and the subsequently formed III-V compound layer. In some embodiments, the thickness of the buffer layer 120 is between about 0.5 μm and about 2 μm.

As shown on FIG. 1, the top of the substrate 110 and the buffer layer 120 includes a first region 100A and a second region 100B, in which the first region 100A includes a first III-V a first III-V compound layer 130A and a second III-V compound layer 140A. According to some embodiments of the invention, the first III-V compound layer 130A and the second III-V compound layer 140A are material layers with different band gaps. According to an embodiment of the invention, the first III-V compound layer 130A and the second III-V compound layer 140A are compounds made from the III-V groups in the periodic table of elements. However, the first III-V compound layer 130A and the second III-V compound layer 140A are different from each other in composition. According to an embodiment of the invention, the first III-V compound layer 130A includes a gallium nitride (GaN) layer. The second III-V compound layer 140A includes an aluminum gallium nitride layer (also referred to as $Al_xGa_{1-x}N$ layer, wherein 0<x<1). The first III-V compound layer 130A and the second III-V compound layer 140A are in direct contact with each other. Since the first III-V compound layer 130A and the second III-V compound layer 140A have different band gaps, a heterojunction is formed in the interface between the first III-V compound layer 130A and the second III-V compound layer 140A.

The first III-V compound layer 130A can be epitaxially grown by metal organic vapor phase epitaxy (MOVPE) using a gallium-containing precursor and a nitrogen-containing precursor. The gallium-containing precursor includes trimethylgallium (TMG), triethylgallium (TEG), or another suitable chemical. The nitrogen-containing precursor includes ammonia ($NH_3$), tertiarybutylamine (TBA), phenyl hydrazine, or another suitable chemical. According to an embodiment of the invention, the first III-V compound layer 130A has a thickness ranging from about 0.5 μm to about 10 μm.

As shown in FIG. 1, the second III-V compound layer 140A is epitaxially grown on the first III-V compound layer 130A. The second III-V compound layer 140A can be epitaxially grown by MOVPE using an aluminum-containing precursor, a gallium-containing precursor, and a nitrogen-containing precursor. The aluminum-containing precursor includes trimethylaluminum (TMA), triethylaluminum (TEA), or another suitable chemical. The gallium-containing precursor includes TMG, TEG, or another suitable chemical. The nitrogen-containing precursor includes ammonia, TBA, phenyl hydrazine, or another suitable chemical. According to an embodiment of the invention, the second III-V compound layer 140A has a thickness ranging from about 5 μm to about 50 μm.

The band gap discontinuity between the second III-V compound layer 140A and the first III-V compound layer 130A, along with the piezo-electric effect, creates a first carrier channel 150A of highly mobile conducting electrons at an interface between the second III-V compound layer 140A and the first III-V compound layer 130A. The first carrier channel 150A is referred to as a two-dimensional electron gas (2-DEG), forming a carrier channel at the interface between the second III-V compound layer 140A and the first III-V compound layer 130A.

The second region 100B includes a third III-V compound layer 130B and the fourth III-V compound layer 140B. As shown in FIG. 1, the fourth III-V compound layer 140B is formed over the third III-V compound layer 130B. According to some embodiments of the invention, the third III-V compound layer 130B and the fourth III-V compound layer 140B are material layers with different band gaps. According to an embodiment of the invention, the third III-V compound layer 130B and the fourth III-V compound layer 140B are compounds made from the III-V groups in the periodic table of elements. However, the third III-V compound layer 130B and the fourth III-V compound layer 140B are different from each other in composition. According to an embodiment of the invention, the third III-V compound layer 130B includes a GaN layer, and the fourth III-V compound layer 140B includes an $Al_xGa_{1-x}N$ layer, wherein 0<x<1. The third III-V compound layer 130B and the fourth III-V compound layer 140B may be in direct contact with each other. The formation process and the material of the third III-V compound layer 130B and the fourth III-V compound layer 140B may be similar to the formation of the first III-V compound layer 130A and the second III-V compound layer 140A, respectively, and the details of the formation process are not repeated herein.

In this embodiment, the band gap discontinuity between the third III-V compound layer 130B and the fourth III-V compound layer 140B, along with the piezo-electric effect, creates a second carrier channel 150B of highly mobile conducting electrons at the interface between the fourth III-V compound layer 140B and the third III-V compound layer 130B. The second carrier channel 150B is also referred to as a two-dimensional electron gas, forming a carrier channel at the interface between the third III-V compound layer 130B and the fourth III-V compound layer 140B.

As shown in FIG. 1, the first region 100A also includes a gate structure G, a source region S and a drain region D, in which the source region S and the drain region D are formed on two opposite sides of the gate structure G and on top of the first III-V compound layer 130A. According to an embodiment of the invention, high electron mobility transistor (HEMT) is formed in the first region 100A.

The source region S and the drain region D include metals selected from the group consisting of titanium, aluminum, nickel, and gold. The source region S and the drain region D can be formed by a process such as physical vapor deposition (PVD), chemical vapor deposition (CVD), atomic layer deposition (ALD), coating, sputtering or other proper technique. In this embodiment, the first carrier channel 150A extends between the source region S and the drain region D. In addition, as shown in FIG. 1, the source region S and the drain region D may penetrate the second III-V compound layer 140A.

As shown in FIG. 1, the gate structure G is formed over the substrate 110, and over the second III-V compound layer 140A. The gate structure G may include a gate electrode layer (not shown) and a gate dielectric layer (not shown). The gate dielectric layer includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate electrode includes one or more layer of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

As shown in FIG. 1, the second region 100B also includes a first electrode T1 and a second electrode T2, in which the first electrode T1 and the second electrode T2 are formed on top of the third III-V compound layer 130B. According to an embodiment of the invention, a resistor is formed in the second region 100B.

The first electrode T1 and the second electrode T2 include one or more layer of conductive material. For example, the first electrode T1 and the second electrode T2 include metals selected from the group consisting of titanium, aluminum, nickel, and gold. The first electrode T1 and the second electrode T2 can be formed by a process such as physical vapor deposition (PVD), chemical vapor deposition (CVD), atomic layer deposition (ALD), coating, sputtering or other proper technique. In this embodiment, the second carrier channel 150B extends between the first electrode T1 and the second electrode T2. In addition, as shown in FIG. 1, the first electrode T1 and the second electrode T2 may penetrate the fourth III-V compound layer 140B.

An insulating layer 160 is formed between the first region 100A and the second region 100B. According to an embodiment of the invention, the insulating layer 160 is formed by mesa etching.

According to another embodiment of the invention, when the bottom III-V compound layer 130 is first formed on the top of buffer layer 120 and the top III-V compound layer 140 is then formed on the top of the bottom III-V compound layer 130, oxygen or nitrogen would be implanted into the bottom III-V compound layer 130 and the top III-V compound layer 140 between the first region 100A and the second region 100B so as to form the insulating layer 160.

Therefore, the insulating layer 160 divides the bottom III-V compound layer 130 into the first III-V compound layer 130A and the third III-V compound layer 130B and divided the top III-V compound layer 140 into the second III-V compound layer 140A and the fourth III-V compound layer 140B.

As shown in FIG. 1, the second III-V compound layer 140A has a first thickness X1 and the fourth III-V compound layer 140B has a second thickness X2. According to an embodiment of the invention, the designer may adjust the second thickness X2 by etching to achieve the target resistance between the first electrode T1 and the second electrode T2.

Figure 2:
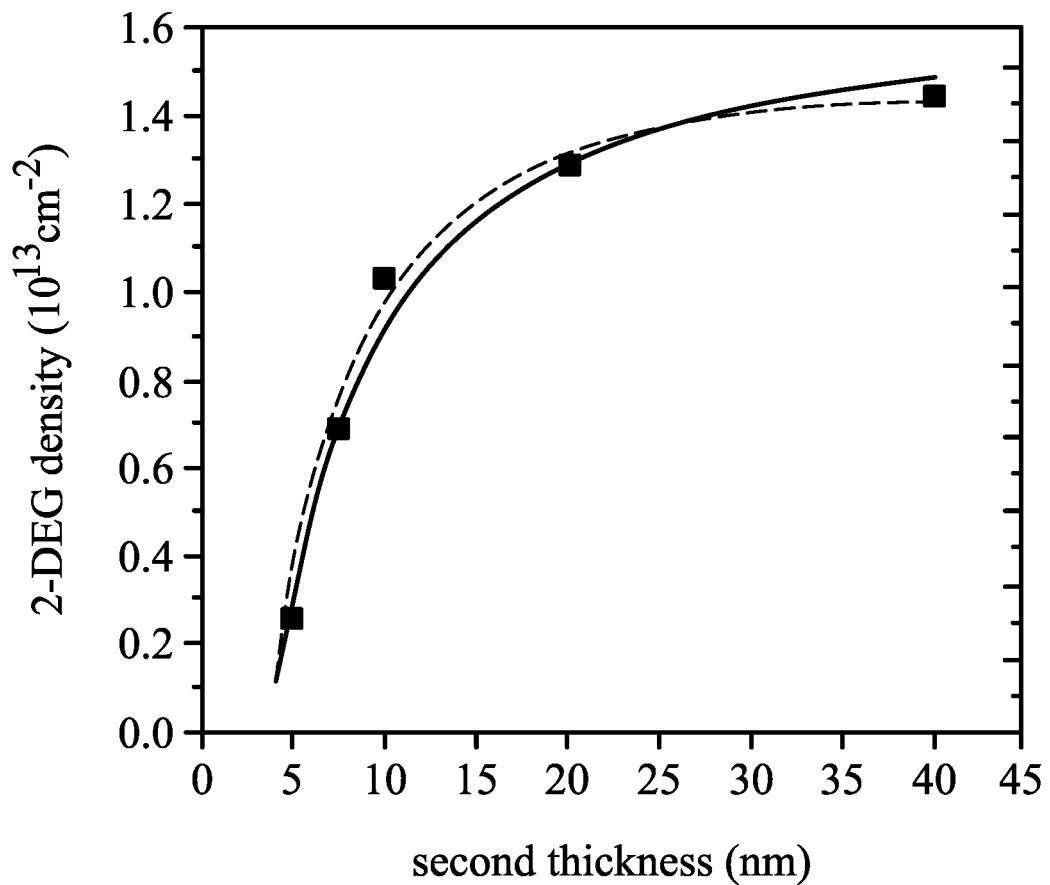
FIG. 2 shows a relationship between 2-DEG density and the second thickness in accordance with an embodiment of the invention.

FIG. 2 shows a relationship between 2-DEG density and the second thickness in accordance with an embodiment of the invention. As shown in FIG. 2, when the second thickness X2 is reduced, 2-DEG is therefore decreased. Namely, when the second thickness X2 of the fourth III-V compound layer 140B is reduced, 2-DEG of the second carrier channel 150B is therefore decreased such that the channel resistance of the second carrier channel 150B is increased. Therefore, the resistance between the first electrode T1 and the second electrode T2 is negatively correlated to the second thickness X2. According to an embodiment of the invention, the second thickness X2 is less than the first thickness X1.

In the embodiment, the insulating layer 160 divides the bottom III-V compound layer 130 into the first III-V compound layer 130A and the third III-V compound layer 130B, and divides the top III-V compound layer 140 into the second III-V compound layer 140A and the fourth III-V compound layer 140B. Then, the thickness of the fourth III-V compound layer 140B is etched to the second thickness X2 so as to achieve the target resistance between the first electrode T1 and the second electrode T2.

Figure 3:
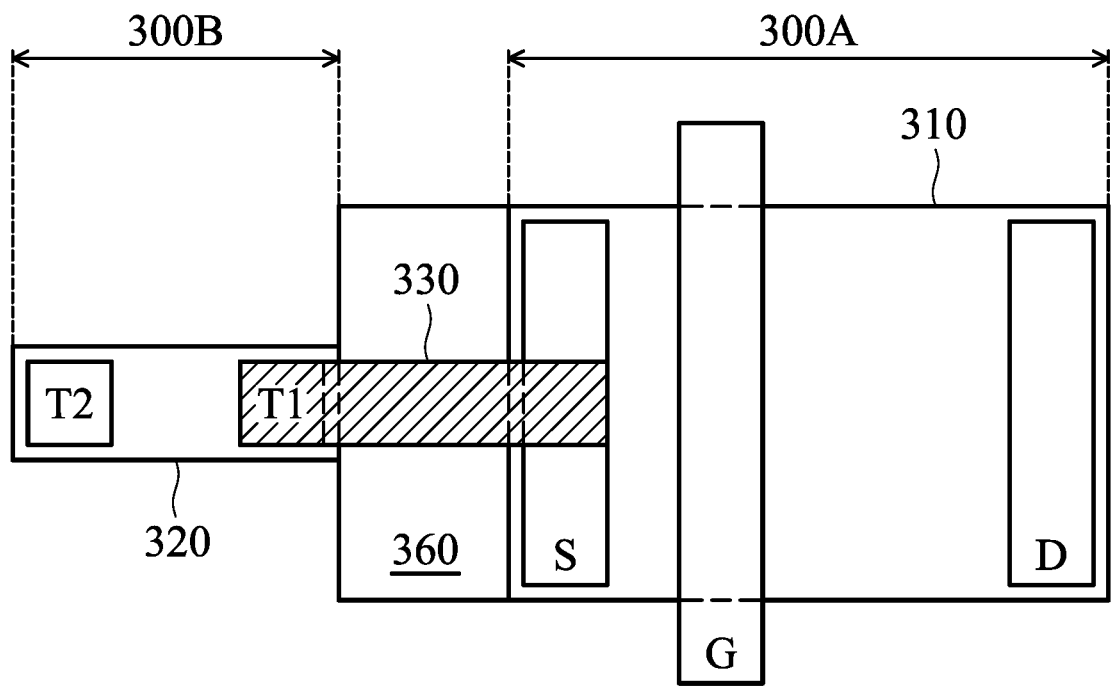
FIG. 3 is a top view of a semiconductor structure in accordance with an embodiment of the invention.

FIG. 3 is a top view of a semiconductor structure in accordance with an embodiment of the invention. As shown in FIG. 3, the semiconductor structure 300 includes a first region 300A, a second region 300B, and an insulating layer 360, in which the HEMT device 310 is formed in the first region 300A, the resistor 320 is formed in the second region 300B, and the insulating layer 360 is formed between the first region 300A and the second region 300B. The first region 300A in FIG. 3 corresponds to the first region 100A in FIG. 1, and the second region 300B in FIG. 3 corresponds to the second region 100B in FIG. 1.

According to an embodiment of the invention, as shown in FIG. 3, the first electrode T1 is electrically coupled to the source region S through a wire 330. According to another embodiment of the invention, the first electrode T1 and the second electrode T2 in FIG. 3 can be altered with each other. In other words, either the first electrode T1 or the second electrode T2 may be electrically coupled to the source region S of the HEMT device 310 through the wire 330.

Figure 4:
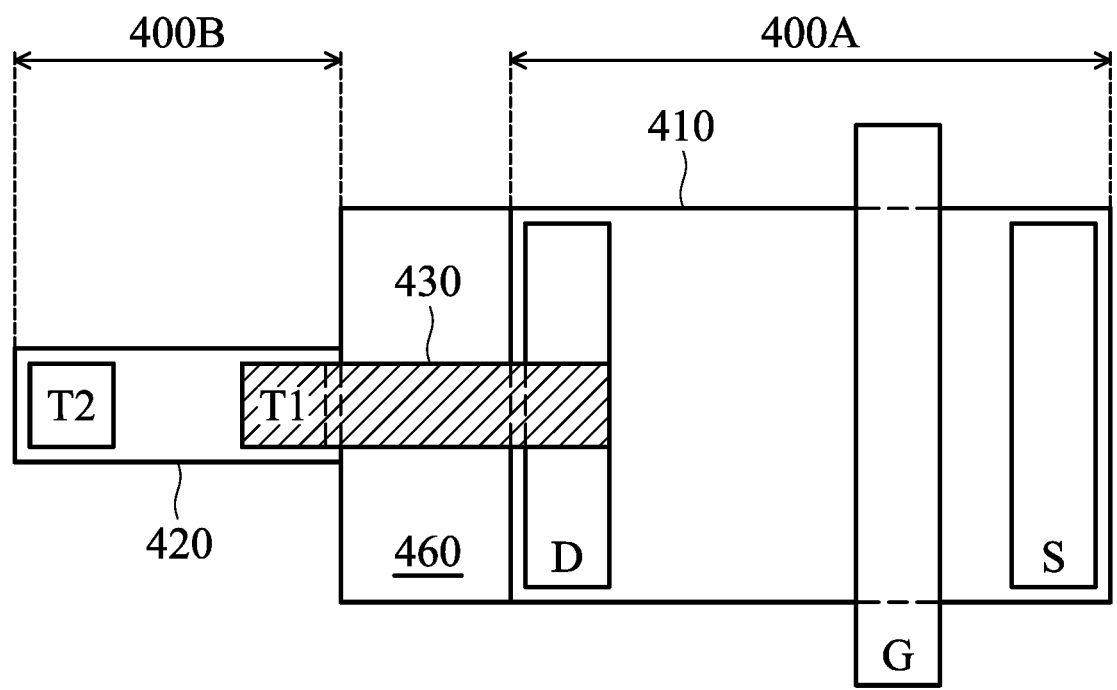
FIG. 4 is a top view of a semiconductor structure in accordance with an embodiment of the invention.

FIG. 4 is a top view of a semiconductor structure in accordance with an embodiment of the invention. As shown in FIG. 4, the semiconductor structure 400 includes a first region 400A, a second region 400B, and an insulating layer 460, in which a HEMT device 410 is formed in the first region 400A, a resistor 420 is formed in the second region 400B, and the insulating layer 460 is formed between the first region 400A and the second region 400B. Comparing FIG. 4 and FIG. 3, the location of the source region S and the drain region D of the HEMT device 410 is different from that of the HEMT device 310.

According to an embodiment of the invention, as shown in FIG. 4, the first electrode T1 is electrically coupled to the source region S through a wire 430. According to another embodiment of the invention, the first electrode T1 and the second electrode T2 in FIG. 4 can be altered with each other. In other words, either the first electrode T1 or the second electrode T2 can be electrically coupled to the source region S of the HEMT device 410 through the wire 430.

Figure 5:
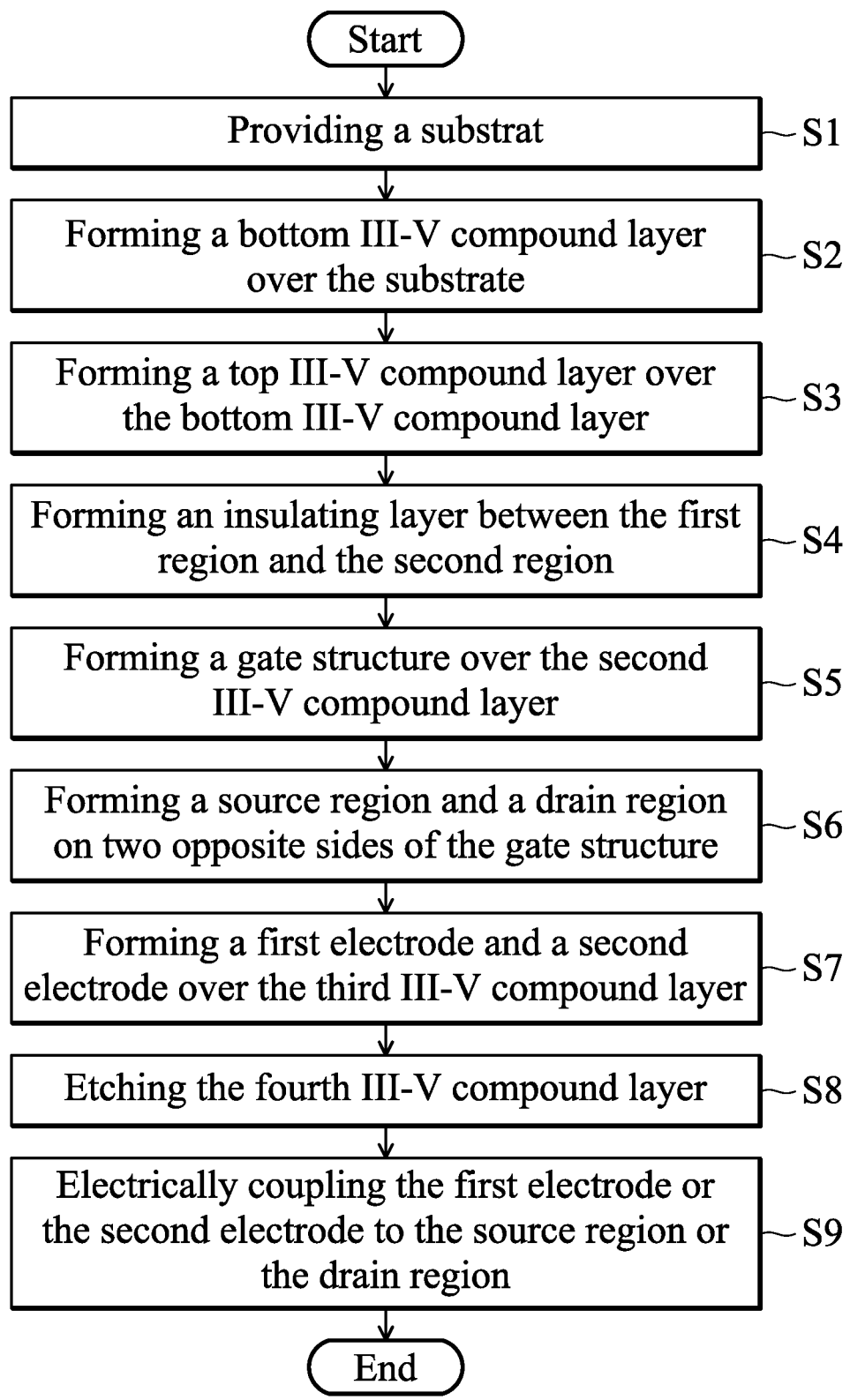
FIG. 5 is a flow chart of a manufacturing method for a semiconductor structure in accordance with an embodiment of the invention.

FIG. 5 is a flow chart of a manufacturing method for a semiconductor structure in accordance with an embodiment of the invention. The following description of FIG. 5 will be accompanied with FIGS. 1, 3 and 4 for the convenience of explanation. As shown in FIG. 5, the substrate 110 in FIG. 1 is first provided (Step S1), in which the top of the substrate 110 includes the first region 100A and the second region 100B. The bottom III-V compound layer 130 is formed on the top of the substrate 110 (Step S2), and the top III-V compound layer 140 is then formed on the top of the bottom III-V compound layer 130 (Step S3).

The insulating layer 160 is formed between the first region 100A and the second region 100B (Step S4) such that the bottom III-V compound layer 130 is divided into the first III-V compound layer 130A and the third III-V compound layer 130B and the top III-V compound layer 140 is also divided into the second III-V compound layer 140A and the fourth III-V compound layer 140B. The first III-V compound layer 130A and the second III-V compound layer 140A are in the first region 100A, while the third III-V compound layer 130B and the fourth III-V compound layer 140B are in the second region 100B. The first carrier channel 150A is formed at the interface between the first III-V compound layer 130A and the second III-V compound layer 140A, while the second carrier channel 150B is formed at the interface between the third III-V compound layer 130B and the fourth III-V compound layer 140B.

Then, the gate structure G is deposited over the second III-V compound layer 140A (Step S5), and the source region S and the drain region D are deposited on two opposite sides of the gate structure G (Step S6), in which the first carrier channel 150A extends between the source region S and the drain region D.

The first electrode T1 and the second electrode T2 are deposited over the third III-V compound layer 130B (Step S7), in which the second carrier channel 150B extends between the first electrode T1 and the second electrode T2. The fourth III-V compound layer 140B is etched (Step S8) to adjust the thickness of the fourth III-V compound layer 140B less than that of the second III-V compound layer 140A, in which the resistance between the first electrode T1 and the second electrode T2 is negatively correlated to the thickness of the fourth III-V compound layer 140B.

Either the first electrode T1 or the second electrode T2 is electrically coupled to the source region S or the drain region D (Step S9). Namely, the first electrode T1 or the second electrode T2 is electrically coupled to the source region S (as shown in FIG. 3), or the first electrode T1 or the second electrode T2 is electrically coupled to the drain region D (as shown in FIG. 4).

Since the HEMT device and the resistor are formed in the same semiconductor structure, the requirement of a resistor in the bill of material (BOM) could be eliminated for some circuit applications and cost of production and the circuit area could be therefore reduced.

Figure 6:
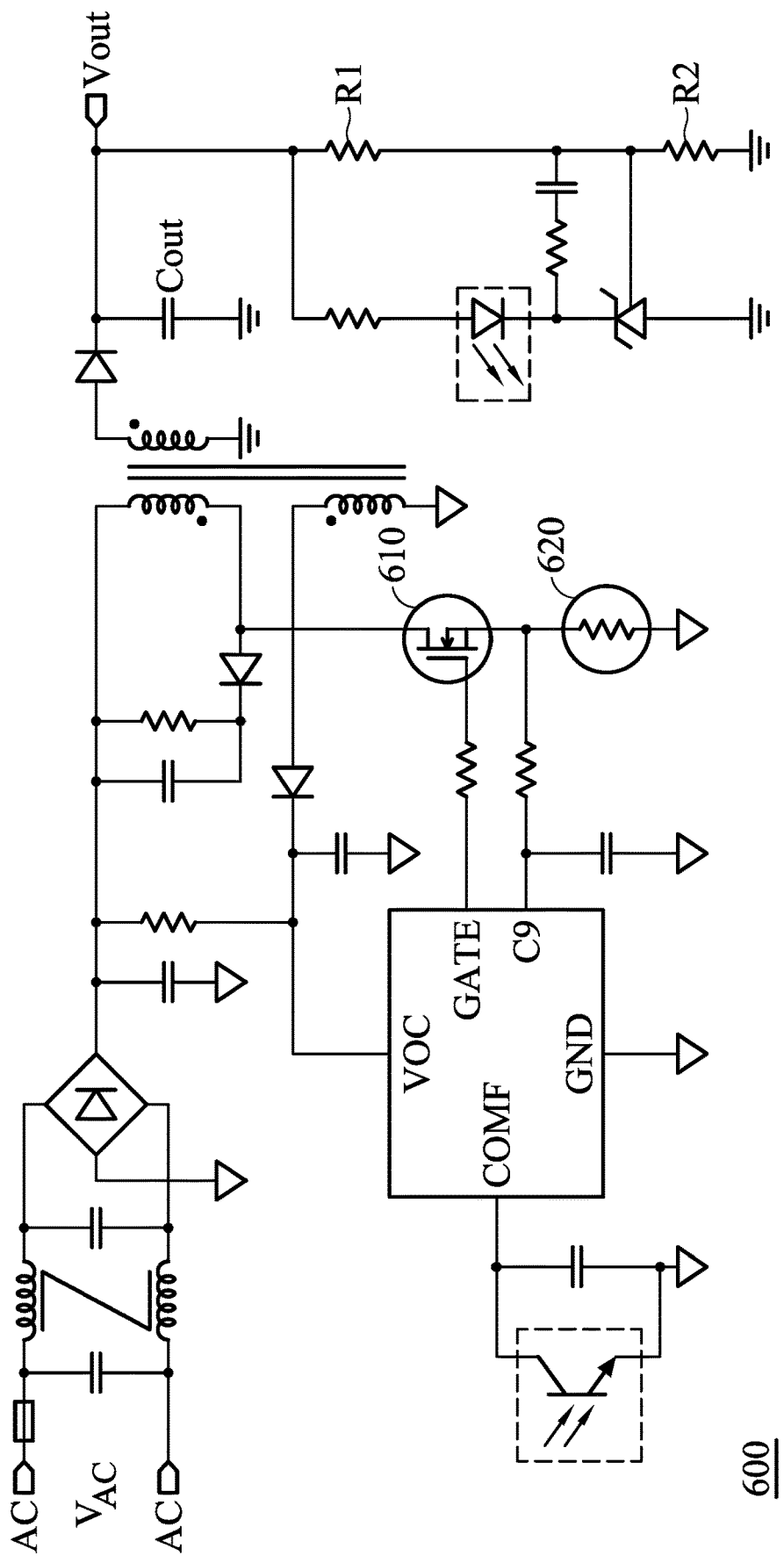
FIG. 6 is a schematic diagram of a flyback power converter in accordance with an embodiment of the invention.

FIG. 6 is a schematic diagram of a flyback power converter in accordance with an embodiment of the invention. As shown in FIG. 6, the flyback power converter 600 includes a HEMT device 610 and a resistor 620, in which the HEMT device 610 and the resistor 620 are coupled to each other. The HEMT device 610 and the resistor 620 can be easily replaced with the single cell of the semiconductor structure combining the HEMT device with the resistor that is provided herein, and the requirement and circuit area of the resistor 620 can be therefore saved. In addition, the semiconductor structure provided herein provides more design flexibility than a conventional one that merely has the HEMT device 610 does. The flyback power converter 600 in FIG. 6 is merely an embodiment for applying the invention, but not intended to be limited thereto.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A manufacturing method of a semiconductor structure, comprising:
   providing a substrate, wherein a top of the substrate comprises a first region and a second region;
   forming a bottom III-V compound layer over the substrate;
   forming a top III-V compound layer over the bottom III-V compound layer;
   forming an insulating layer between the first region and the second region such that the bottom III-V compound layer is divided into a first III-V compound layer and a third III-V compound layer and the top III-V compound layer is divided into a second III-V compound layer and a fourth III-V compound layer;
   wherein the first III-V compound layer and the second III-V compound layer are deposited in the first region, and the third III-V compound layer and the fourth III-V compound layer are deposited in the second region;

wherein a first carrier channel is formed at an interface between the first III-V compound layer and the second III-V compound layer, and a second carrier channel is formed at an interface between the third III-V compound layer and the fourth III-V compound layer;

forming a first electrode over the third III-V compound layer;

forming a second electrode over the third III-V compound layer, wherein the second carrier channel extends between the first electrode and the second electrode; and etching the fourth III-V compound layer such that the fourth III-V compound layer has a second thickness less than a first thickness of the second III-V compound layer, wherein resistance between the first electrode and the second electrode is negatively correlated to the second thickness.

2. The manufacturing method of claim 1, further comprising:

forming a gate structure over the second III-V compound layer; and forming a source region and a drain region on two opposite sides of the gate structure, wherein the first carrier channel extends between the source region and the drain region.

3. The manufacturing method of claim 1, further comprising:

electrically coupling the first electrode or the second electrode to the source region.

4. The manufacturing method of claim 1, further comprising:

electrically coupling the first electrode or the second electrode to the drain region.

* * * * *